United States Patent [19]

Nakahashi et al.

[11] Patent Number: 4,611,745
[45] Date of Patent: Sep. 16, 1986

[54] METHOD FOR PREPARING HIGHLY HEAT-CONDUCTIVE SUBSTRATE AND COPPER WIRING SHEET USABLE IN THE SAME

[75] Inventors: Masako Nakahashi, Kawasaki; Makoto Shirokane; Tatsuo Yamazaki, both of Tokyo; Hisashi Yoshino, Yokohama; Akio Hori, Kawasaki; Hiromitsu Takeda, Tokyo, all of Japan

[73] Assignee: Kabushiki Kaisha Toshiba, Kawasaki, Japan

[21] Appl. No.: 696,181

[22] Filed: Jan. 29, 1985

[30] Foreign Application Priority Data

Feb. 24, 1984 [JP] Japan ................................. 59-32628

[51] Int. Cl.⁴ ............................................. B23K 31/02
[52] U.S. Cl. ..................................... 228/123; 228/121
[58] Field of Search ............. 228/121, 123, 124, 180.2

[56] References Cited

U.S. PATENT DOCUMENTS 3,609,471 9/1971 Scace ............................. 228/124 X

FOREIGN PATENT DOCUMENTS 2534777 3/1976 Fed. Rep. of Germany ...... 228/124
56-96784 8/1981 Japan .
56-163093 12/1981 Japan .

OTHER PUBLICATIONS

Fischer et al., "Rapidly-Quenched Active Brazing Foils for Metal-Ceramic Bonding", presented at the 8th Annual Meeting of the American Ceramic Society, May 2–5th, 1982.

Primary Examiner—Kuang Y. Lin
Attorney, Agent, or Firm—Schwartz, Jeffery, Schwaab, Mack, Blumenthal & Evans

[57] ABSTRACT

A method for preparing a highly heat conductive substrate which comprises interposing an active layer with a thickness of 0.5 to 10 μm comprising silver (Ag) and an active metal selected from the group consisting of titanium, zirconium and hafnium, and also copper (Cu) optionally, between an aluminium nitride (AlN) substrate and a copper member; and joining said aluminium nitride (AlN) substrate and said copper (Cu) member with each other by heating. A copper wiring sheet comprising the above active layer is also usable in the method.

12 Claims, 7 Drawing Figures

METHOD FOR PREPARING HIGHLY HEAT-CONDUCTIVE SUBSTRATE AND COPPER WIRING SHEET USABLE IN THE SAME

BACKGROUND OF THE INVENTION

This invention relates to a method for preparing a highly heat-conductive substrate and a copper wiring sheet (hereinafter "Cu wiring sheet") usable in the method.

Recently for a power semiconductor element, various requirements such as high density integration, hybridization and further control of a large quantity of current and the like made severe. When an attempt is made to satisfy the aforesaid requirements, a large amount of heat generated from the semiconductor element raises a problem. Thus, it is necessary to radiate the large quantity of heat generated to prevent elevation of temperature of the semiconductor element.

From these viewpoints, there have heretofore often been used a power semiconductor module as shown in FIG. 1 employing a heat radiation substrate. In FIG. 1, numeral 1 denotes a heat sink made of copper (Cu) and the like. On the heat sink 1, a first insulating plate $Z_1$ made of aluminuim oxide $Al_2O_3$ is joined through a solder layer 3a in order to insulate the heat sink from a thermal diffusion plate described below. On the insulating plate $Z_1$, the thermal diffusion plate 4 is joined through a solder layer 3b. Further, on the thermal diffusion plate 4, second insulating plates $Z_2$ made of $Al_2O_3$ are joined through solder layers 3c in order to insulate the thermal diffusion plate 4 from a semiconductor elements to be mounted. On these insulating plates $Z_2$, semiconductor elements 5 are joined through solder layers 3d, respectively. In this Figure, numeral 6 are each a joining layer formed between the insulating plate $Z_1$ or $Z_2$ and the solder layers.

However, a thermal radiation substrate used in conventional power semiconductor modules has a drawback that it is extremely complicated in construction as shown in FIG. 1. This is ascribable to the fact that $Al_2O_3$ constituting the first and second insultation plates $Z_1$ and $Z_2$ is low in thermal conductivity (20 W/m.°C.) although high in dielectric strength (100 kV/cm), so that both functions, radiation and insulation, are required to be satisfied by employing both materials, Cu and $Al_2O_3$ by themselves.

On the other hand, recently aluminium nitride (AlN) has attracted attention since it has excellent dielectric strength (140 to 170 kV/cm) and thermal conductivity (90 W/m.°C.) and tried to be joined to a copper (Cu) member to form a module substrate. AlN, however, is inferior in wettability with brazing materials hence it is difficult to obtain a sufficient joining strength even if joining of an AlN member to a Cu member are tried by use of silver brazing materials and the like.

SUMMARY OF THE INVENTION

It is an object of this invention to provide a preparation method capable of forming thereby easily a high heat-conductive substrate resolving the aforementioned problems and having not only simplified structure and good insulation dielectric strength but also excellent radiation characteristics.

The present inventors have studied intensively a joining method applicable to AlN which is low in wettability with brazing materials although excellent in electric insulating property and thermal conductivity, and as a result, have found that as a method for preparing a highly heat-conductive substrate suitable for mounting heat generating elements theron, such as a power semiconductor module substrate and the like, a highly heat-conductive substrate having excellent characteristics such as good wettability with AlN, a low joining temperature and the like can be obtained by interposing an active layer comprising silver (Ag) and an active metal (Ti, Zr, Hf, etc.), and also copper (Cu) optionally, between an AlN substrate and a Cu member, followed by heating to join the AlN substrate to the Cu member. In the above method, it is preferred to form the active layer to have a thickness of 0.5 to 10 $\mu$m, and it is more preferred to provide the active layer by forming a silver layer, a copper layer and an active metal layer (e.g., Ti or Zr layer) to have a thickness of 0.2 to 9 $\mu$m, 0 to 9 $\mu$m and 0.1 to 5 $\mu$m, respectively, whereby joining between the AlN substrate and the Cu member can be performed easily and securely without any excess joining materials overflowing from the members to be joined.

In another embodiment of this invention, said active layer comprising a silver layer and an active metal layer, or these two layers and a copper layer may be previously provided on the surface of a copper sheet to obtain a Cu wiring sheet, which is then provided on the AlN substrate so that the active layer side thereof may be in contact with the same, followed by heating for joining.

DESCRIPTION OF THE PREFERRED EMBODIMENTS

In this invention, as the active metal, there may be used at least one or more of any metal selected from the group consisting of elements in the IV A group of the periodic table, for example Ti, Zr, Hf, etc, or an alloy containing the above elements as main components.

This invention can widely be applied to highly heat-conductive ceramics including aluminium nitride (AlN) and silicon carbide (SiC), and also $Al_2O_3$ which has been heretofore often used, which are to be used as a ceramic substrate to be joined.

DETAILED DESCRIPTION OF THE PREFERRED EMBODIMENTS

Figure 1:
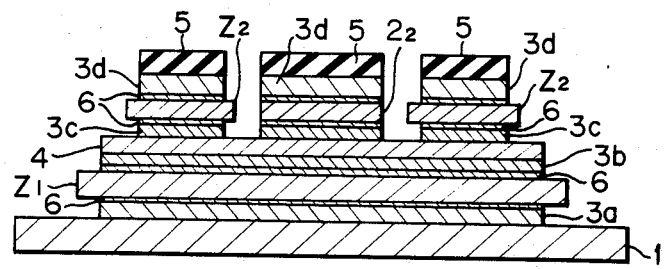
FIG. 1 is a cross-sectional view of a power simiconductor module having the conventional radiation substrate.

The method for preparing the highly heat-conductive substrate according to this invention will be given below taking an example in which Ti is used as the active metal layer.

At first, an active layer comprising Ag layer and Ti layer, or Ag layer, Ti layer and Cu layer, and having a thickness of 0.5 to 10 μm is interposed between an AlN substrate and a Cu member.

In this step, methods for interposing the active layer may include a method of employing Ag, Ti and Cu metal foils; a method of laminating Ag, Ti and Cu on an AlN member or a Cu member by a sputtering method, a vacuum evaporation method or a plating method, and a method in which some of the metal foil method, the sputtering method, the vacuum evaporation method and the like are combined.

In any method described above, where the active layer comprising Ag layer and Ti layer and having a thickness of 0.5 to 10 μm is interposed, it is preferred that the Ag layer is 0.2 to 9 μm thick and the active metal (such as Ti and the like) layer is 0.1 to 5 μm thick. In the case where the active layer comprising Ag layer, Ti layer and Cu layer and having a thickness of 0.5 to 10 μm is interposed, it is preferred that Ag layer is 0.2 to 9 μm thick, then active metal (such as Ti and the like) layer is 0.1 to 5 μm thick and Cu layer is not more than 9 μm thick.

When the active layer comprising Ag layer and Ti layer, or Ag layer, Ti layer and Cu layer, is less than 0.5 μm in thickness, high bonding strength between the AlN substrate and the Cu member can not be obtained, while when the active layer is more than 10 μm in thickness, molten materials overflow to the outer side of the joining part during fusing by heat with the result of loss of a function as a substrate.

Although Ag layer and Ti layer, or Ag layer, Ti layer and Cu layer, may be interposed between AlN substrate and Cu member in any order, the most stable joining part can be obtained by arranging Ti layer, Ag layer and further Cu layer, if necessary, in this order, on the surface of the AlN substrate.

The number of layers of each of Ag, Ti and Cu to be interposed is not necessarily limited to a single layer but, if desired, a plurality of the layers can be interposed without impairing the characteristic features of this invention. Lamination of Ag layer, Ti layer or Cu layer by a sputtering method, a vacuum evaporation method and the like may be effected on either AlN substrate or Cu member but a method of laminating Ti layer, Ag layer and optionally Cu layer on the Cu member in this order may provide a procedually easy method and also give stable joining materials.

Then the joining part between AlN substrate and Cu member are heated in a vacuum or inert atmosphere. In this step, the joining part may be heated and a pressure of 0 to 1 Kg/mm² is applied as required; application of pressure is basically not necessary. Heating temperature is required to be lower than the melting point of Cu member. Specifically, heating may be effected within the range of 780° to 1082° C. By this heat-treatment, fused Ag-Cu-Ti alloy liquid is formed between AlN substrate and Cu member. When the active layer comprising Ag and Ti is employed, the surface portion of Cu member in contact with the Ag-Ti layer is fused in part at the above-mentioned temperature by eutectic reaction with Ag to form Ti-Ag-Cu alloy layer. Subsequently, the thus obtained alloy is cooled to obtain a highly heat-conductive power semiconductor module substrate in which the AlN substrate and the Cu member are securely joined without any Ag-Ti-Cu alloy fused liquid overflowed towards the joining part or the outer side thereof.

In another embodiment according to this invention, the active layer comprising Ag layer and Ti layer, or Ag layer, Ti layer and Cu layer, is previously provided on the surface of a Cu sheet which is a wiring layer to obtain a Cu wiring sheet, which is then provided on the AlN substrate so that the active layer side thereof may be contact with the AlN substrate, followed by heating to convert said layer to an alloy, therby joining to the AlN substrate.

In this embodiment, methods for providing the active layer on the surface of Cu sheet may include, for example, (1) a method in which an active metal layer and a soft metal layer are laminated directly by a vacuum evaporation, a sputtering method or a plating method, (2) a method in which an active metal foil and a soft metal foil are joined on the Cu sheet by use of bonding agents, (3) a method in which powders of an active metal or soft metal are mixed with an organic solvent to form a paste and the resulting paste is then applied on a Cu sheet and a method in which the methods (1) to (3) are combined.

In this embodiment, the order for interposing the active layer between the ceramic substrate and the Cu sheet is the same as in the embodiment first described above.

As methods for processing the Cu wiring sheet according to this invention into the desired shape, there may be used any methods, for example, press processing, photoetching processing, etc. The Cu sheet of this invention is excellent in processability because it has an excellent ductility and has structure comprising basically a Cu sheet which can be readily etched, and on which simply an active layer with a thickness of 10 μm or less is provided.

Next, a method for joining the present Cu wiring sheet to a ceramic substrate will be described below.

The Cu wiring sheet of this invention is laminated on a ceramic substrate so that the active layer side of the sheet may be in contact with the ceramic substrate and then the joining part of both members are heated by means of high frequency induction and the like in a vacuum or an inert atmosphere. In this case, there may be applied a small pressure (0 to 1 Kg/mm²) to the extent to bring the joining surfaces in close contact during heating, although it is basically not necessary to apply pressure.

The heating temperature is required to be less than the melting point of Cu sheet, and preferably ranges from 780° to 1082° C. By such a heat treatment, a fused alloy liquid, for example, of Ag-Cu-Ti is formed between the ceramic substrate and the Cu sheet, and the resulting liquid is solidified by the subsequent cooling without any liquid overflowed towards the outer side of the joining part, and thereby the ceramic substrate and Cu sheet are joined securely to form a ceramic substrate suitable for a high power semiconductor substrate.

Examples of this invention in which the present power semiconductor module substrate is employed will be illustrated below with reference to the accompanying drawings.

EXAMPLE 1

Figure 2:
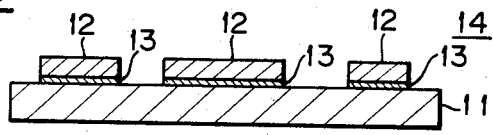
FIG. 2 is a cross-sectional view of a power semiconductor module substrate in Example 1 of this invention.

First, as shown in FIG. 2, plural sheets of Cu member 12 having a Ti layer with a thickness of 0.5 μm and a Ag layer with a thickness of 1.0 μm deposited thereon in this order as an active layer, by a vacuum evaporation method, and a AlN substrate 11 functioning simultaneously as an insulating plate, a radiation plate and a heat sink were washed and degreased with trichlene and acetone, and then set in a hot press maintained at a vacuum degree of $2\times10^{-5}$ torr, in such a manner so that the thus vacuum evaporated side of the Cu member may be in close contact with the AlN substrate.

Subsequently, pressure of 0.1 Kg/mm$^2$ was applied on a joining part between the AlN substrate and the plural sheets of Cu member from both lower and upper directions, and the joining part was maintained at 830° C. for 10 minutes by means of high frequency heating to form a fused Ag-Ti-Cu alloy liquid. After heating, the resulting liquid was cooled in an argon gas atmosphere to obtain a power semiconductor module substrate 14 having structure in which the Cu member 12 was joined to the AlN substrate through a Ag-Ti-Cu alloy layer 13 obtained from the active layer comprising Ag layer and Ti layer.

The thus obtained semiconductor module substrate was one in which the AlN substrate 11 and the Cu member 12 were securely joined with each other through the alloy layer 13 and no overflowing of the alloy layer from the joining part was observed.

Figure 3:
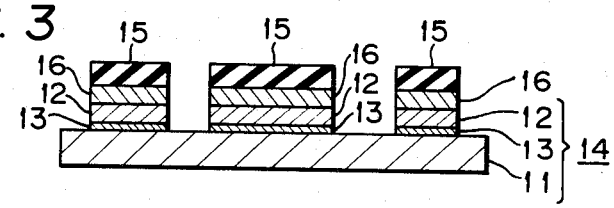
FIG. 3 is a cross-sectional view of a power semiconductor module having semiconductor elements mounted on the module substrate shown in FIG. 2.

As shown in FIG. 3, by mounting a semiconductor element 15 on the Cu member 12 of the above module substrate 14 through Pb-Sn type solder 16, there was obtained a power semiconductor module having thermal conductivity of 88 W/K.cm in a direction from the semiconductor element 15 to the AlN substrate 11 (thickness direction) and being capable of radiating effectively a large quantity of heat generated in the semiconductor 15 from the Cu member 12 and the AlN substrate 11.

EXAMPLE 2

Figure 4:
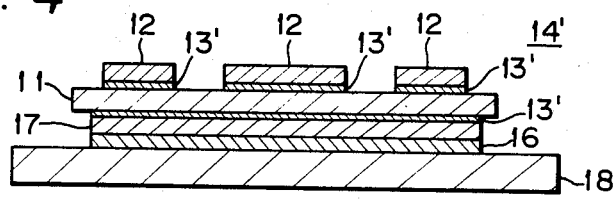
FIG. 4 is a cross-sectional view of a power semiconductor module substrate in Example 3 of this invention.

As shown cross-sectionally in FIG. 4, plural sheets of Cu members 12 and a thermal diffusion plate 17, each having an Ag layer with a thickness of 2 μm and a Ti layer with a thickness of 1 μm deposited in this order, respectively, on the joining surfaces defined between an AlN substrate 11, by a vacuum evaporation method followed by degreasing with trichlene and acetone, and also an AlN substrate 11 which was also washed with trichlene and acetone were set in a hot press maintained at a vacuum degree of $2\times10^{-5}$ torr, so that the thus vacuum evaporated sides of the Cu member 12 and the thermal diffusion plate 17 may be in close contact with upper and lower surface of the AlN, respectively.

Subsequently, pressure of 0.1 Kg/mm$^2$ was applied on joining parts between the upper Cu member 12 and the lower thermal diffusion plate 17 from both lower and upper directions, and the joining parts between the AlN substrate 11 and Cu member 12 and between the AlN substrate 11 and the thermal diffusion plate 17 were maintained at 830° C. for 10 minutes by means of high frequency heating to form a fused Ag-Ti-Cu alloy liquid. The resulting liquid was then cooled in an argon gas atmosphere to join the Cu member 12 on the upper surface of AlN substrate 11, and the thermal diffusion plate 17 on the lower side of the AlN substrate 11 through Ag-Ti-Cu alloy 13, respectively.

The thus obtained semiconductor module substrate 14' is one in which the AlN substrate 11 and the Cu member 12, and the AlN substrate 11 and the thermal diffusion plate 17 are securely joined with each other through the alloy layer 13', respectively, and no overflowing of the alloy layers 13' from the joining part is observed.

Figure 5:
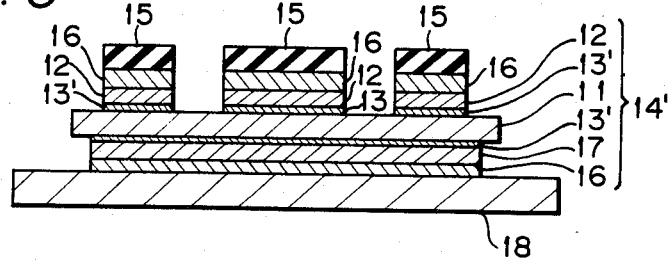
FIG. 5 is a cross-sectional view of a power semiconductor module having semiconductor elements mounted on the module substrate shown in FIG. 4.

As shown in FIG. 5, by mounting a semiconductor element 15 on the Cu member 12 of the above module substrate 14' through Pb-Sn type solder 16, there was obtained a power semiconductor module having thermal conductivity of 88 W/K.cm in a direction from the semiconductor element 15 to the AlN substrate 11 (thickness direction) and being capable of radiating effectively a large quantity of heat generated in the semiconductor 15 from the Cu member 12, the AlN substrate 11, thermal diffusion plate 17 and the heat sink 18.

EXAMPLE 3

First, an AlN substrate having a Ti layer with a thickness of 0.5 μm deposited thereon by a vacuum evaporation method, and also plural sheets of Cu member 12 having an Ag layer with a thickness of 3 μm plated thereon and then having a Ti layer with a thickness of 0.5 μm deposited thereon by a vacuum evaporation method were washed and degreased with trichlene and acetone, and then set in a hot press maintained at a vacuum degree of $2\times10^{-5}$ torr, so that the thus vacuum evaporated sides or plated side of the AlN substrate and the Cu member are in close contact with each other.

Subsequently, pressure of 0.1 Kg/mm$^2$ was applied on a joining part between the AlN base plate and the plural sheets of Cu member from both lower and upper directions, and the joining part was maintained at 830° C. for 10 minutes by means of high frequency heating to form fused Ag-Ti-Cu alloy liquid. After heating, the resulting liquid was cooled in an argon gas atmosphere to obtain a power semiconductor module substrate having structure in which the Cu member was joined to the AlN substrate through Ag-Ti-Cu alloy layer.

The thus obtained semiconductor module substrate is one in which the AlN substrate and the Cu member are securely joined with each other through the alloy layer and no overflowing of the alloy layer from the joining part is observed.

By mounting a semiconductor element on the Cu member of the above module substrate through Pb-Sn type solder, there can be obtained a power semiconductor module having thermal conductivity of 88 W/K.cm in thickness direction and being capable of radiating effectively a large quantity of heat generated in the semiconductor from the Cu member and the AlN substrate.

EXAMPLE 4

First, plural sheets of Cu member 12 having a Ag layer with a thickness of 1 μm and a Ti layer with a thickness of 0.6 μm deposited thereon in this order by a vacuum evaporation method, and also an AlN substrate were washed and degreased with trichlene and acetone, and then set in a hot press maintained at a vacuum degree of $2\times10^{-5}$ torr, so that the thus vacuum evaporated side of the Cu member is in close contact with the AlN.

Subsequently, pressure of 0.1 Kg/mm$^2$ was applied on a joining part between the AlN substrate and the plural sheets of Cu member from both lower and upper directions, and the joining part was maintained at 830° C. for 10 minutes by means of high frequency heating to form fused Ag-Ti-Cu alloy liquid. After heating, the resulting liquid was then cooled in an argon gas atmosphere to obtain a power semiconductor module substrate.

The thus obtained semiconductor module substrate is one in which the AlN substrate and the Cu member 12 are securely joined with each other through the alloy layer 13 and no overflowing of the alloy layer from the joining part is observed. By observing the joining part by a microscope of 100 magnifications, the substrate thus obtained is confirmed to have a good joining state without any generation of crack in the AlN substrate.

Moreover, by mounting a semiconductor element on the Cu member of the above module substrate through Pb-Sn type solder, as in the same manner as in Example 1 there can be obtained a highly reliable power semiconductor module having a heat conductivity of 88 W/K.cm in a thickness direction and being capable of radiating effectively a large quantity of heat.

EXAMPLE 5

First, plural sheets of Cu member 12 having a Ti layer with a thickness of 0.5 μm, an Ag layer with a thickness of 2 μm and a Cu layer with a thickness of 2 μm deposited thereon in this order by a vacuum evaporation method, and also a AlN substrate were washed and degreased with trichlene and acetone.

Subsequently, pressure of 0.1 Kg/mm$^2$ was applied on a joining part between the AlN substrate and the plural sheets of Cu member which was set so that the thus vacuum evaporated side of the Cu member is in close contact with the AlN, from both lower and upper directions, and the joining part was maintained at 830° C. for 10 minutes in a highly pure argon gas (Ar) atmosphere retained at 830° C. to form an Ag-Ti-Cu alloy layer. The resulting layer was cooled in an argon atmosphere to obtain a power semiconductor module substrate having structure in which the Cu member was joined to the AlN substrate through the Ag-Ti-Cu alloy layer.

The thus obtained semiconductor module substrate is one in which the AlN substrate and the Cu member are securely joined with each other through the alloy layer and no overflowing of the alloy layer from the joining part is observed.

By mounting a semiconductor element on the Cu member of the above module substrate through Pb-Sn type solder, there can be obtained a power semiconductor module having thermal conductivity of 88 W/K.cm in a thickness direction and being capable of radiating effectively a large quantity of heat generated in the semiconductor from the Cu member and the AlN substrate.

EXAMPLE 6

Figure 6:
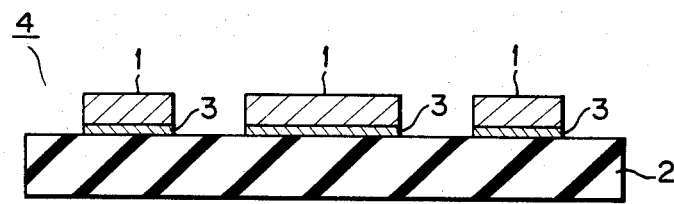
FIG. 6 is a cross-sectional view of a power semiconductor module substrate employing the Cu wiring sheet of this invention.

Cu wiring sheet having a Ti layer with a thickness of 1 μm and a Ag layer with a thickness of 4 μm deposited thereon in this order and in a total thickness of 5 μm, as an active layer, by a vacuum evaporation method was processed to form the predetermeined shape by a photoetching method. As shown in FIG. 6, plural sheets of the Cu wiring sheet 1 and the AlN substrate 2 functioning simultaneously as an insulating plate, a radiation plate and a heat sink were washed and degreased with trichlene and acetone, and then set in a hot press maintained at a vacuum degree of $2\times10^{-5}$ torr, so that the thus vacuum evaporated side of the Cu member is overlapped over the AlN substrate 2 in contact with the AlN.

Subsequently, while a pressure of 0.1 Kg/mm$^2$ was applied on a joining part between the AlN substrate 2 and the Cu wiring sheet from both lower and upper directions, the joining part was maintained at 830° C. for 10 minutes by means of high frequency heating to form fused Ag-Ti-Cu alloy liquid. After heating, the resulting liquid was cooled in an argon gas atmosphere to obtain a power semiconductor module substrate 4 having structure in which the Cu wiring sheet 1 was joined to the AlN substrate 2 through Ag-Ti-Cu alloy layer 3 obtained by fusing and solidifying of Ti active layer, as shown in FIG. 6

The thus obtained semiconductor module substrate 4 is one in which the AlN substrate 2 and the Cu member 1 are securely joined with each other through the alloy layer 3 and no overflowing of the alloy layer 3 from the joining part is observed.

Figure 7:
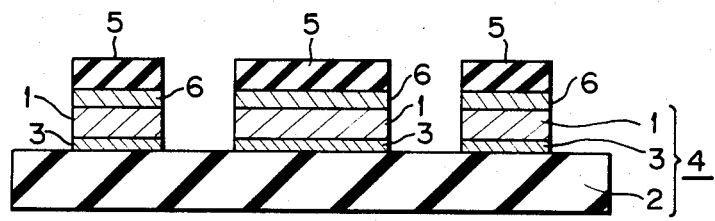
FIG. 7 is a cross-sectional view of a power semiconductor module having semiconductor elements mounted on the module substrate shown in FIG. 6.

As shown in FIG. 7, semiconductor elements 5 were mounted on the above module substrate 4 through Pb-Sn type solder 6. The measurement of a heat conductivity in a direction from the semiconductor element 5 to the AlN substrate 2 (thickness direction) gives a value of 88 W /K.cm, and the substrate was confirmed to have capabily of radiating effectively a large quantity of heat gererated in the semiconductor 5 through the Cu wiring sheet and the alloy layer 3 towards the AlN substrate 2 and to have a good joining state between the Cu wiring sheet and AlN substrate 2.

EXAMPLE 7

A Cu wiring sheet 1 having a Ti layer with a thickness of 2 μm deposited thereon by a vacuum evaporation and then having a Ag foil with a thickness of 5 μm adhered thereto by use of an organic bonding agent was processed to form into the predetermined shape by blanking processing.

Then the Cu wiring sheet 1 thus obtained and the AlN substrate 2 were washed and degreased with trichlene and acetone, and then set in a hot press maintained at a vacuum degree of $2\times10^{-5}$ torr, so that the active layer deposited side of the Cu member is in contact with the AlN.

Subsequently, pressure of 0.05 Kg/mm$^2$ was applied on a joining part between the AlN substrate 2 and the Cu wiring sheet 1 from both lower and upper directions, and the joining part was maintained at 830° C. for 10 minutes by means of high frequency heating to form fused Ag-Ti-Cu alloy liquid. After heating, the resulting liquid was cooled in an argon gas atmosphere to form a power semiconductor module substrate 4 having structure in which the Cu wiring sheet 1 was joined to the AlN substrate 2 through an alloy layer obtained by fusing and solidifying of the Ag-Ti-Cu active layer as shown in FIG. 6.

The thus obtained semiconductor module substrate 4 is one in which the AlN substrate 2 and the Cu wiring sheet 1 are securely joined with each other through the alloy layer 3 and having a good joining state without any overflowing of the alloy layer 3 from the joining part.

We claim:

1. A method for preparing a highly heat conductive substrate which comprises interposing an active layer with a thickness of 0.5 to 10 μm comprising silver and an active metal selected from the group consisting of titanium, zirconium and hafnium, between an aluminium nitride substrate and a copper member; and joining said aluminium nitride substrate and said copper member with each other by heating.

2. The method according to claim 1, wherein said active layer comprises a silver layer with a thickness of 0.2 to 9 μm, and a layer of said active metal with a thickness of 0.1 to 5 μm.

3. The method according to claim 2, wherein said active metal layer comprises titanium.

4. The method according to claim 1, wherein a Cu wiring sheet having said active layer provided on the surface of said copper member is joined to said aluminuim nitride substrate in such a manner so that the active layer on the copper member may be in contact with the AlN substrate.

5. The method according to claim 4, wherein said active layer comprises a silver layer with a thickness of 0.2 to 9 μm, and a layer of said active metal with a thickness of 0.1 to 5 μm.

6. The method according to claim 5, wherein said active metal layer comprises titanium.

7. The method according to claim 1, wherein said active metal further comprises copper.

8. The method according to claim 7, wherein said active metal comprises a copper layer having a thickness of $\leqq 9$ μm.

9. The method according to claim 1, wherein said interposing step comprises sputtering said silver and said active metal onto said aluminum nitride substrate.

10. The method according to claim 1, wherein said interposing step comprises vacuum evaporating said silver and said active metal onto said aluminum nitride substrate.

11. The method according to claim 1, wherein said interposing step comprises sputtering said silver and said active metal onto said copper member.

12. The method according to claim 1, wherein said interposing step comprises vacuum evaporating said silver and said active metal onto said copper member.

* * * * *